(12) United States Patent
Arora et al.

(10) Patent No.: US 8,612,923 B2
(45) Date of Patent: *Dec. 17, 2013

(54) METHODS, SYSTEMS, AND COMPUTER-PROGRAM PRODUCTS FOR ITEM SELECTION AND POSITIONING SUITABLE FOR HIGH-ALTITUDE AND CONTEXT SENSITIVE EDITING OF ELECTRICAL CIRCUITS

(75) Inventors: Rajan Arora, Faridabad (IN); Chayan Majumder, Delhi (IN); Sandipan Ghosh, New Delhi (IN); Anil Kumar Arya, Ghaziabad (IN)

(73) Assignee: Cadence Design Systems, Inc., San Jose, CA (US)

( * ) Notice: Subject to any disclaimer, the term of this patent is extended or adjusted under 35 U.S.C. 154(b) by 489 days.

This patent is subject to a terminal disclaimer.

(21) Appl. No.: 12/489,265

(22) Filed: Jun. 22, 2009

(65) Prior Publication Data

US 2010/0205575 A1 Aug. 12, 2010

Related U.S. Application Data

(63) Continuation-in-part of application No. 12/366,911, filed on Feb. 6, 2009, now Pat. No. 8,271,909.

(51) Int. Cl.
*G06F 17/50* (2006.01)

(52) U.S. Cl.
USPC ........... 716/139; 716/118; 716/119; 715/243; 715/244; 715/245; 715/246; 715/247; 715/700; 715/764; 715/788

(58) Field of Classification Search
USPC .................. 716/118, 119, 139; 715/243–246, 715/764–773
See application file for complete search history.

(56) References Cited

U.S. PATENT DOCUMENTS

| | | | |
|---|---|---|---|
| 6,480,995 B1 * | 11/2002 | Schmidt et al. ............... | 716/112 |
| 6,791,548 B2 | 9/2004 | Dutta et al. | |
| 7,020,853 B2 * | 3/2006 | Skoll et al. .................... | 716/111 |
| 7,178,114 B2 * | 2/2007 | Lin et al. ....................... | 716/122 |
| 7,441,220 B2 * | 10/2008 | Hetzel et al. .................. | 716/135 |
| 7,921,390 B2 * | 4/2011 | Archambeault et al. ...... | 716/106 |
| 8,117,565 B2 * | 2/2012 | Murphy ........................ | 715/860 |
| 2005/0229134 A1 * | 10/2005 | Hetzel et al. ................... | 716/10 |

OTHER PUBLICATIONS

Martin, Tutorial Cadence Design Environment, New Mexico State University, Oct. 2000, pp. 1-51.*

* cited by examiner

*Primary Examiner* — Nghia Doan
(74) *Attorney, Agent, or Firm* — Holland & Knight, LLP; Mark H. Whittenberger, Esq.

(57) ABSTRACT

Methods, systems, computer program products for editing electrical circuits that facilitate and speed the layout of electrical circuits. Embodiments provide high-altitude editing capabilities to the user that enable the user to more easily select circuit items in congested layouts and schematic diagrams, and modify and arrange circuit items with respect to one another in congested layouts and schematic diagrams. Additional embodiments are directed to enabling EDA commands and the like to have context sensitivity, neighborhood awareness, and/or an ability to anticipate intentions of the user.

36 Claims, 10 Drawing Sheets

METHODS, SYSTEMS, AND COMPUTER-PROGRAM PRODUCTS FOR ITEM SELECTION AND POSITIONING SUITABLE FOR HIGH-ALTITUDE AND CONTEXT SENSITIVE EDITING OF ELECTRICAL CIRCUITS

CROSS-REFERENCES TO RELATED APPLICATIONS

This application is a continuation-in-part of, and claims priority to, U.S. application Ser. No. 12/366,911, filed Feb. 6, 2009, titled "System and Method for Aperture Based Layout Data Analysis to Achieve Neighborhood Awareness", which is incorporated herein by reference in its entirety for all purposes.

BACKGROUND OF THE INVENTION

The present application relates to designing circuits, and more particularly, some embodiments related to tools used in designing and editing circuit schematics and circuit layouts.

Circuit designs are becoming much more complex, and the complexity in creating circuit designs has commensurately increased. In an effort to better deal with the difficulties in design, circuit designers use Electronic Design Automation ("EDA") tools during the circuit design phase. EDA tools, also referred to as electronic computer aided design ("ECAD") tools, reduce a circuit designer's effort in designing and editing circuit layouts. Typically, EDA tools are provided integrated design environments ("IDEs") that have graphical user interfaces ("GUIs"). A graphical user interface (GUI) allows a circuit designer to create a circuit schematic or layout visually and interactively, by making commands and inputs through the tool's GUI. With a GUI, a designer can easily issue commands to the EDA tool and edit features and components of a circuit schematic or layout on a display canvas. Usually, the features and components appear on the canvas as various wires, boxes, shapes, polygons, etc., which represent the features and components of the displayed circuit.

Typically, when working with an EDA tool, a circuit designer uses layout commands to create and modify the circuit design. Generally, conventional EDA tool commands are not concerned with where on the canvas they are executed, and do not provide the designer with suggestions for the next possible steps for the command. As such, these layout commands, some of which are context-sensitive (also referred to as interactive commands), do not anticipate the circuit designer's intentions, and do not aid the user in selecting items of the circuit to act upon.

When using a conventional EDA tool in a large circuit, the circuit designer often has to add or modify objects in highly congested areas with many other objects displayed on the canvas. In these conditions, the designer often has to modify the view of the canvas with several zoom-in, zoom-out, and pan commands while using the commands that add or modify objects. That is, the designer often has to go from a "high-altitude" view of the circuit to a "low-altitude" view and back again to execute the desired task. For example, this can occur when a designer wants to move a circuit object close to another object on the same layer such that the edges of the two objects are spaced at some desired value. With conventional methods using the traditional move command, the designer selects the object, selects a reference point on the object, and moves the object to the destination point. However, during this process, the designer zooms in (increases the magnification of the display canvas) and pans to make the edges of the objects sufficiently visible to judge the desired spacing between the edges of the objects. Afterwards, the designer pans and zooms out to the prior view to continue the layout process. The need to zoom-in, pan, and zoom-out is disruptive to the designer's workflow and productivity. As a similar example, a circuit designer often needs to measure distances in a circuit layout using the ruler command. The conventional ruler command usually fixes the end points of the ruler at the locations where the user clicks the mouse button. In order to fix the end points accurately, the user zooms in and out and pans the view of the canvas to fix the end points, which is disruptive to the designer's workflow and productivity.

BRIEF SUMMARY OF THE INVENTION

The present application discloses methods, systems, computer program products for editing electrical circuits that facilitate and speed the layout of electrical circuits. Embodiments of the present application are directed to providing high-altitude editing capabilities to the user that enable the user to more easily select circuit items in congested layouts and schematic diagrams, and to more easily modify and arrange circuit items with respect to one another in congested layouts and schematic diagrams. Additional embodiments of the present application are also directed to enabling EDA commands and the like to have context sensitivity, neighborhood awareness, and/or an ability to anticipate intentions of the user.

One exemplary embodiment of the invention is directed to a method for a graphical circuit editor, the method comprising detecting a command from a user, defining an aperture around an input cursor, collecting a set of items, each item being at least partly located within the aperture, the items being associated with a circuit, selecting one or more items from the set as one or more targets suitable for the command to operate upon, and presenting one or more of the targets to the user for selection.

Another exemplary embodiment of the invention is directed to a computer program product, comprising a computer-usable medium having a computer-readable program code embodied therein, the computer-readable program code adapted to be executed to implement a method of circuit editing. The method may comprise: detecting a command from a user, defining an aperture around an input cursor, collecting a set of items, each item being at least partly located within the aperture, the items being associated with a circuit, selecting one or more items from the set as one or more targets suitable for the command to operate upon, and presenting one or more of the targets to the user for selection.

Another exemplary embodiment of the invention is directed to a graphical circuit editor (e.g., editing system) comprising a computer system with a processor and memory running under the direction of the above exemplary computer program product embodiment.

The above aspects and exemplary embodiments of the invention are described in the Detailed Description with reference to the Figures. In the Figures, like numerals may reference like elements and descriptions of some elements may not be repeated.

DETAILED DESCRIPTION OF THE INVENTION

Figure 13:
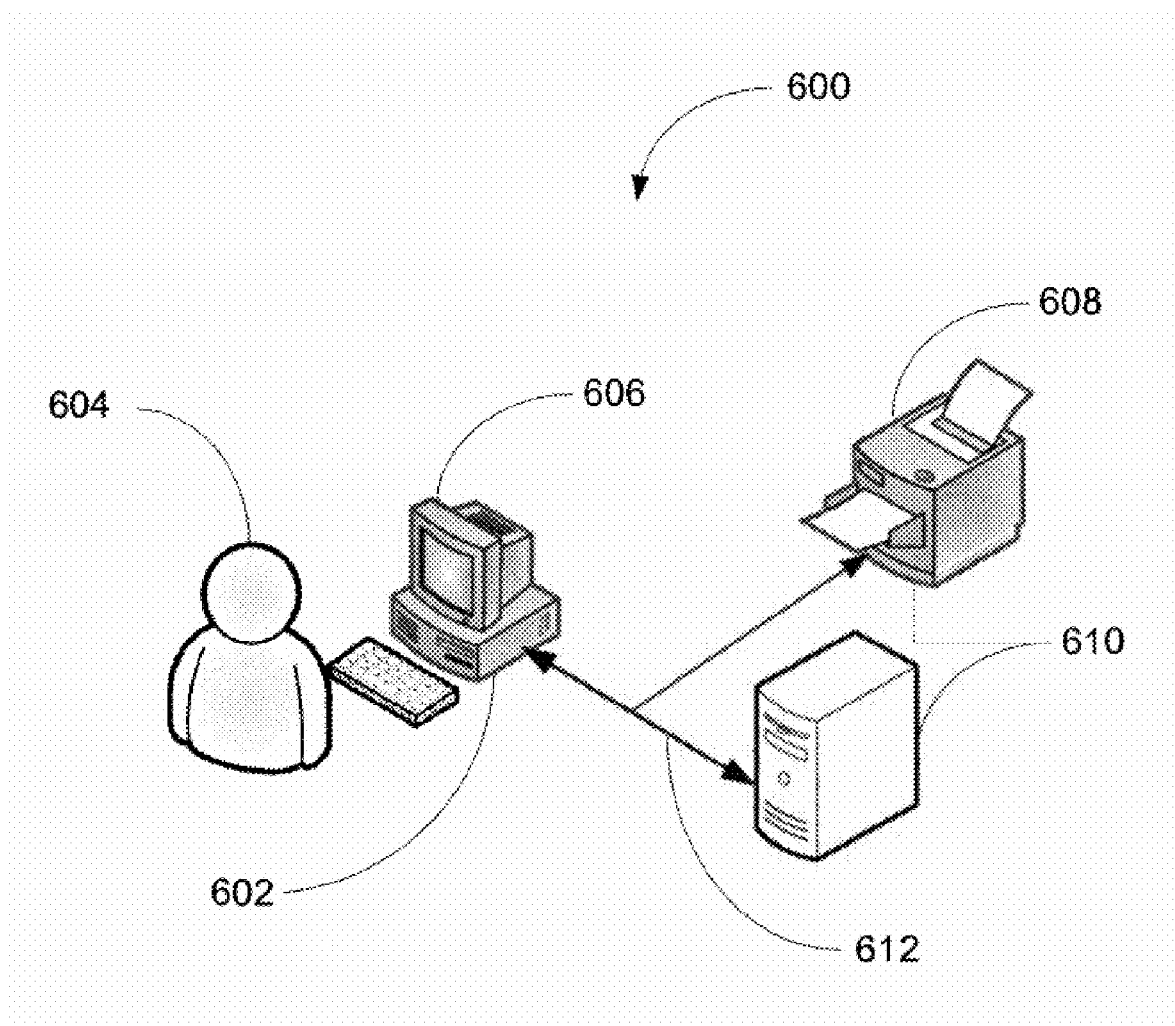
FIG. 13 is a diagram illustrating an example environment in which some embodiments of the invention can be implemented.

Before describing various exemplary embodiments, it is useful to describe an exemplary environment with which embodiments of the invention may be implemented. One such example is illustrated in FIG. 13, which depicts a computer aided design system 600 that can be used by a designer 604 to design, for example, electronic circuits. System 600 can include a computer 602 and a monitor 606. The computer can be a laptop computer, desktop computer, handheld computer, mainframe computer, etc. Any computing system capable of running software implementing the systems and methods described herein can be used. Monitor 606 can be a CRT, flat screen, etc.

A circuit designer 604 can input commands into computer 602 using various input devices, such as a mouse, keyboard, track ball, touch screen, etc. If computer 602 comprises a mainframe, designer 604 can access computer 602 using, for example, a terminal or terminal interface. Additionally, computer 602 may be connected to a printer 608 and a server 610 using a network 612. Server 610 may, for example, be used to store additional software programs and data. In one embodiment, software implementing the systems and methods described herein can be stored on a hard drive in server 610. Thus, the software can be run from the hard drive in server 610. In another embodiment, software implementing the systems and methods described herein can be stored on a hard drive in computer 602. Thus, the software can be run from the hard drive in computer 602. Therefore, in this embodiment, the software can be used whether or not computer 602 is connected to network 612. Printer 608 may be connected directly to computer 602, in which case computer 602 can print whether or not it is connected to network 612.

Computers 602, servers 610, printers 608, and computer networks 612 are well known. Therefore, for the sake of brevity, other exemplary environments will not be discussed. It will, however, be apparent to those of skill in the art that the methods, systems and computer program products described herein can be used in conjunction with many different environments. Computer 602 can be the same as or similar to computer system 500, which is discussed below in detail with reference to FIG. 12.

From time to time, features and aspects of exemplary embodiments of the present invention are described herein in terms of the exemplary environment. Description in terms of the exemplary environment is provided to allow the various features and aspects of embodiments of the invention to be portrayed in the context of an exemplary application. After reading this description, it will become apparent to one of ordinary skill in the art how the invention can be implemented in different and alternative environments.

A circuit may be viewed and edited on several different levels. The present invention is applicable to all such levels. One such level is the schematic format level, which illustrates the circuit on a display canvas as a collection of block components, wire interconnections, buses, nodes, individual transistors, and other schematic objects. The display canvas may be implemented as a portion of a display monitor visible to the user. Another such level is the layout format level, which illustrates the circuit as a collection of polygons, paths, vias, macro-cells, parameterized cells ("P-cells"), and other layout objects to be formed in a plurality of processing layers of a semiconductor wafer or, in some cases, a circuit board substrate. The processing layers of a semiconductor wafer typically include diffusion, gate metal, via, metal-1, metal-2, etc. In each format level, the components of the circuit are disposed in a coordinate space to enable the circuit components to be displayed and/or laid out. The circuit may be created and edited at the schematic format level by using a circuit schematic editor, and at the layout format level by using a circuit layout editor, both of which are examples of EDA tools and are generically referred to herein as circuit editors or graphical circuit editors. A circuit schematic editor and a circuit layout editor may be constructed as separate entities, or may be integrated together to work from a common data representation (e.g., database representation) of the circuit.

Figure 2:
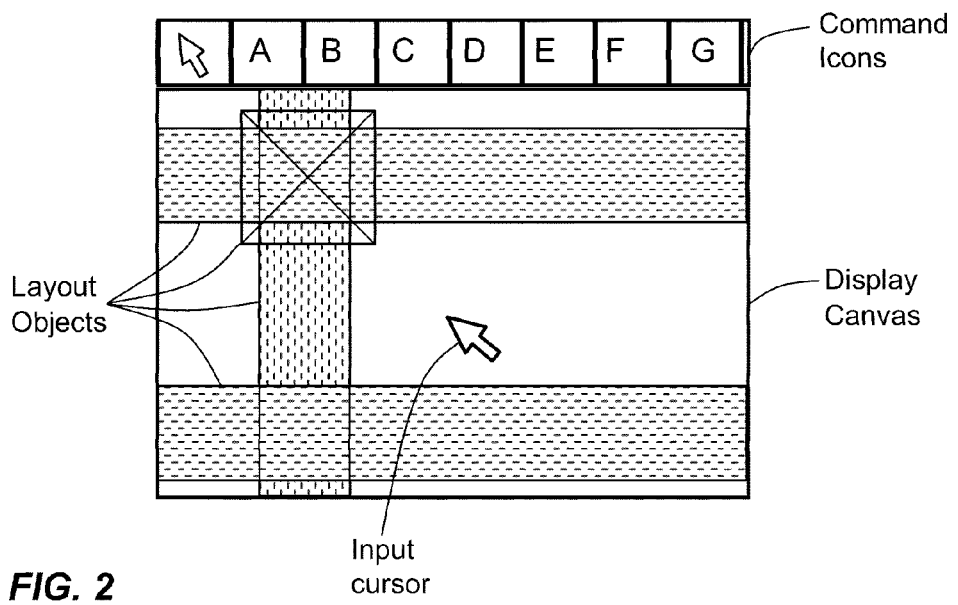
FIGS. 2-9 and 10A-10C are screen shots of the display canvas illustrating various exemplary embodiments of various features of the present invention.

Each of the circuit schematic editor and circuit layout editor has a number of commands that enable the circuit designer to add, delete, resize, stretch, and move objects (e.g., schematic objects or layout objects), and to connect objects. Each circuit editor may provide an icon on the monitor (or on a portion of the monitor adjacent to the display canvas) for each editing command, to which the user can move the input cursor and click to access the corresponding command. The circuit schematic editor may have a command to create each type of schematic object or layout object. After clicking the icon for such a creation command, the user can then move the input cursor to the display canvas and issue one or more mouse clicks (e.g., index-finger mouse clicks) on the display canvas to define the new object in a desired location of the circuit. FIG. 2 illustrates a portion of a GUI interface of an exemplary circuit layout editor. The circuit layout editor has a display canvas for showing a view of the circuit layout, and a set of command icons (generically labeled as A-G) that the user may click on with the input cursor to execute corresponding commands. Only portions of these areas are shown for the sake of visual clarity. As an example, four layout objects are visible in the display canvas: two horizontal rectangles of metal-1, one vertical rectangle of metal-2, and a via that connects the top horizontal rectangle to the vertical rectangle.

Each circuit editor may be configured to have a selection command, which has a corresponding icon (e.g., upper left icon in FIG. 2), to which the user can move the input cursor and click to activate. When activated, the user is able to move the input cursor over the display canvas, position the cursor on an object, and click on it (e.g., index-finger mouse click) to select the object. With the object selected, the circuit editor may allow the user to modify or move the selected schematic object by moving the input cursor to a corresponding command icon, clicking on the command icon, and moving the input cursor back to the display canvas to issue one or more clicks to modify the object. During the move, modify, or stretch commands, various handles of the object may be displayed, which the user may select to control the command's operation. In addition to command icons, representations of some of the basic move and modify commands may be displayed in a pop-up menu which can be activated by moving the input cursor to a desired object and issuing a second-finger click on the mouse (the second finger is adjacent to the index finger). When the pop-up menu comes up, the user may place the cursor over the desired command and release the second-finger click, or issue an index-finger click on the mouse. The pop-up menu saves the user time by avoiding the movement of the input cursor from the display canvas to the command icon, and back. While it is useful to have the above-described object selection command, the circuit editor may be configured to execute the object selection command when other commands are not being executed, thereby avoiding the need to provide an icon for the object selection command.

A circuit layout editor may also have a command to check a selected portion of the circuit layer for design-rule violations, which is useful to run after the placement or modification of a layout object. Each circuit editor may also have a plurality of navigation commands to allow the user to display a small portion of the circuit in the display canvas at high magnification. Such navigation commands may include commands to zoom in, pan left, pan right, pan up, pan down, and zoom out. The navigation commands are useful in allowing the user to magnify congested parts of the circuit for viewing and editing, which is often called "low-altitude" editing. At low altitude, the full scope of the circuit is not visible. At lower magnification, more or all of the scope can be seen, which is often called "high-altitude" viewing. While adding or editing objects at "high-altitude" is possible, it typically is not feasible since objects of the circuit usually need to be aligned or connected at "low-altitude."

Figure 1:
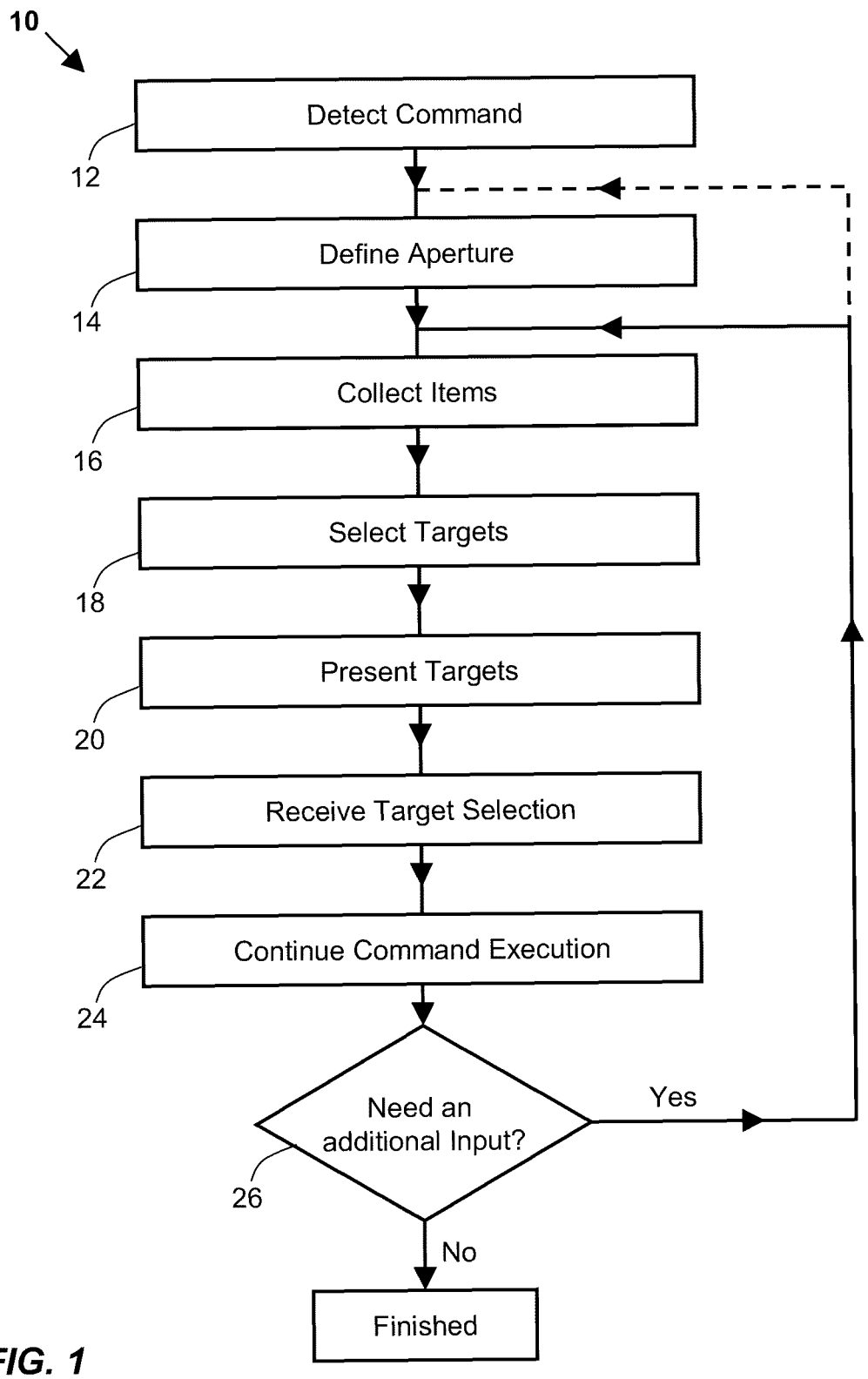
FIG. 1 is a flowchart illustrating an exemplary method in accordance with an exemplary embodiment of the present invention.

FIG. 1 is a flowchart illustrating an exemplary method 10 in accordance with an exemplary embodiment of the present invention. Method 10 comprises a plurality of actions, which are described below in greater detail. Using method 10, a circuit editor can provide high-altitude editing capabilities to the user that enable the user to more easily select items in congested layouts and schematic diagrams, and to modify and arrange items with respect to one another in congested layouts and schematic diagrams. Using method 10, a circuit editor may provide its commands with context sensitivity, neighborhood awareness, and/or an ability to anticipate intentions of the user.

Method 10 comprises an action 12 that captures or detects a command issued by the user, such as through a circuit editor with the user clicking on a command icon (shown in FIG. 2). Such commands may include a command to define a new item in the circuit, to modify the position, size, shape, or another characteristic of an item, to stretch a dimension of an item (such as a P-cell or macro-cell), a command to define a ruler or marker, etc. Method 10 further comprises an action 14 that defines an aperture, or collection window, around the input cursor. Action 14 may occur before or after action 12. The aperture (or collection window) comprises an area in the coordinate space on which the circuit is displayed and/or laid out, and is disposed around the location of the input cursor. In some embodiments, the aperture may comprise a circuit or rectangle centered about the location of the input cursor. The size of the aperture may be fixed or selectable, and may vary in relation to the magnification of the view shown in the display canvas. In various implementations of method 10, the dimensions of the aperture may be selected by the user (e.g., user-controllable). The input cursor may move around the display canvas, and the aperture moves in relation to the movement of the input cursor. The movement of the aperture may have a time lag with respect to the movement of the input cursor.

Figure 3:
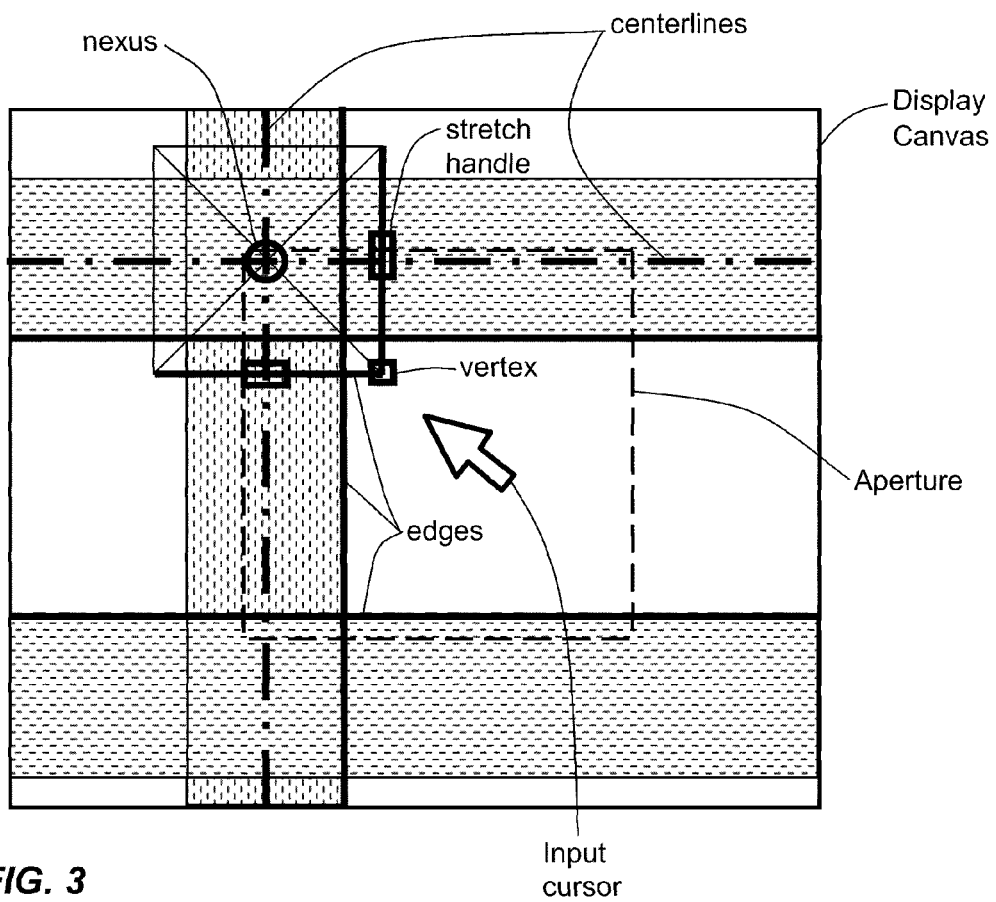

Method 10 further comprises an action 16 of collecting a set of items, each item being at least partly located within the aperture and associated with a circuit that is being edited by the user. As indicated above, the circuit may be displayed in a schematic format, in which case an item may comprise a schematic object, an edge of a schematic object, a vertex of a schematic object, an end of a schematic object, a nexus of a schematic object, a handle of a schematic object, etc. Schematic objects include, but are not limited to, component blocks, buses, wires, nodes, transistors. Alternatively, or in addition thereto, the circuit may be displayed in a layout format, in which case an item may comprise: a layout object, an edge of a layout object, a vertex of a layout object, an end of a layout object, a midpoint of an object, a centerline of an object, a nexus of an object, a handle of a layout object, etc. Layout objects are items for chip layouts of circuits on a semiconductor dice, or traces and vias on substrates and the like. Layout objects include, but are not limited to, polygons, paths, vias, macro-cells, P-cells, etc. Items may also include editing aids, such as rulers, markers, etc. Rulers measure distances in layouts, and markers provide information about the circuit at corresponding marker locations in the circuit. A layout item for a circuit layout format may also include an allowable location to place an object or stretch a dimension of an object, the allowable location being determined by a design-rule checking (DRC) engine that looks at nearby objects and the design rules for the manufacturing process that will be used to implement the circuit. FIG. 3 shows an enlarged view of a display canvas of an exemplary circuit layout editor showing an aperture around the input cursor. The items that are at least partially within the aperture include the layout objects (rectangles and via) and the other items highlighted with thick lines. The other items include: the nexus, two edges, two stretch handles, and vertex for the via, a centerline and a lower edge for the top horizontal rectangle, an upper edge for the bottom top horizontal rectangle, and a centerline and a right edge for the vertical rectangle.

Figure 4:
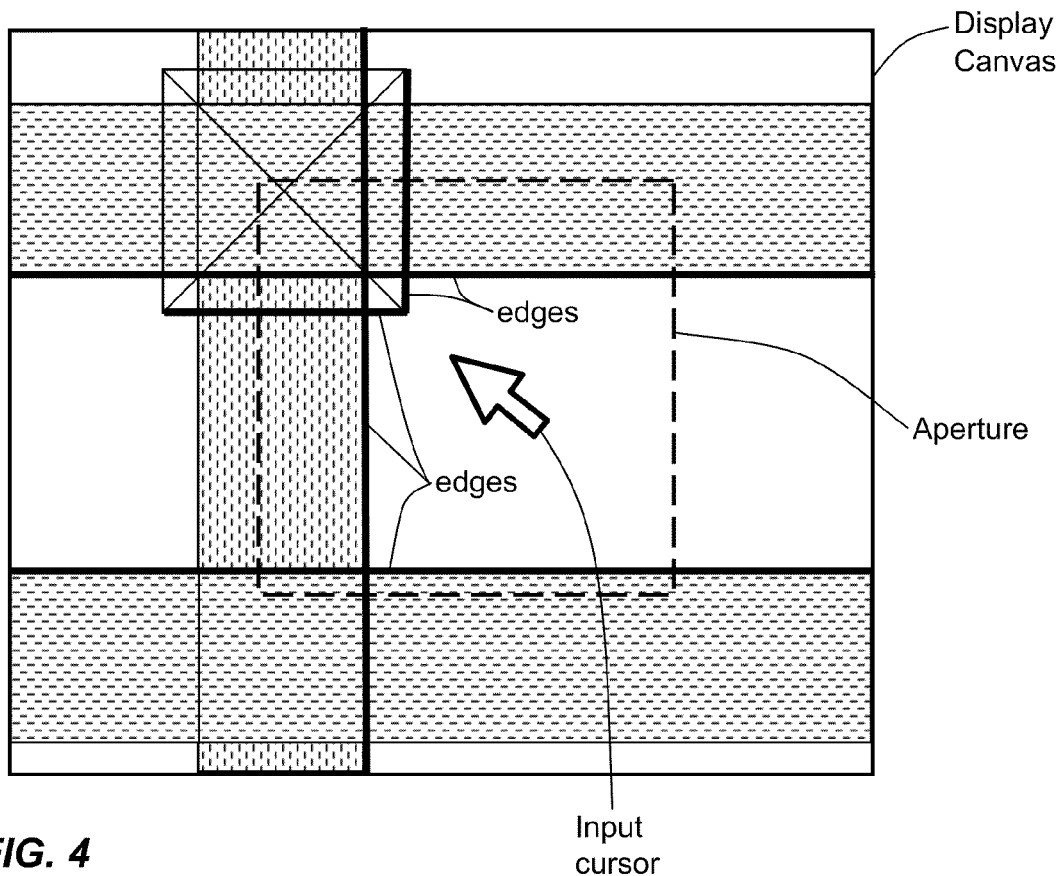

Depending on the embodiment, the items collected at action 16 may be all of the items that are at least partially within the aperture, or may be only the items that are at least partially within the aperture and are: (1) relevant to the operation to be performed by the detected command, and/or (2) of an item type previously selected by the user (selected such as by one or more previously-issued configuration commands or customizable user settings for the detected command). An item type can be the item's object type in the EDA database (e.g., path, rectangle, polygon, via, instance, etc.), and it may also include a process layer of a circuit layout, such as diffusion, gate metal, metal-1, metal-2, etc. As an example of collecting items based on relevancy to detected command, the detected command may comprise a command to define a new item in the circuit, and collecting the set of items may comprise collecting items based upon at least one characteristic of the new item. As an example of collecting items based on an item type previously selected by the user, a ruler command in a circuit layout editor may be configured to allow the user to restrict the placement of the ruler's end point to edges of the layout objects. With the election of such a restriction by the user, the items collected by action 16 are narrowed to object edges, as illustrated by the highlighted edges in FIG. 4. An example of collecting items based on an item's object type could be to consider only path or path segments (database objects) for collecting items in a specific command setting. Accordingly, action 16 may collect items in the aperture based on one or more of: (i) relevancy to the detected command, (ii) one or more characteristics of the items, (iii) on at least one characteristic of a new item being created in the circuit and the relevancy of the characteristics of the items in the aperture to the at least one characteristic of the new item, (iv) one or more customizable user settings for the detected command, (v) one or more customizable global user settings applicable to a plurality of commands (e.g., setting for the editing environment).

Method 10 further comprises an action 18 of selecting one or more of the collected items as one or more targets suitable for the detected command to use (e.g., to operate upon). Action 18 may comprise selecting as targets all of the items collected by action 16. Action 18 may also comprise selecting as targets only the items collected by action 16 that are: (1) relevant to the operation to be performed by the detected command (e.g., context sensitive), and/or (2) of an item type previously selected by the user (selected such as by one or more previously-issued configuration commands or customizable user settings for the detected command). As an example of selecting targets based on relevancy to the detected command, the detected command may comprise a command to define a new path object in the circuit, and the action of selecting the targets to which the start point of new path object can be aligned is context-sensitive and based upon at least one characteristic of the new object, such as the object's processing layer. As another example, the target items for the second point of a ruler can be selected to be those items that are on the same processing layer as the target item used to define the first point of the ruler. Selecting the targets in the above examples may be further based on an optional setting selected by the user, such a setting to limit the targets to edge, vertex, and/or centerline items. An example of collecting items based on an item type previously selected by the user may be the same as that described above with regard to action 16.

Action 18 may further comprise sorting the targets in one or more orders of relevancy. In selecting and sorting the targets for relevancy, action 18 may use characteristics or properties of the detected command (e.g., the command being performed), and/or the current context in which the detected command is being performed to identify the relevancy of the targets and establish the one or more criteria upon which the targets may be ordered. For example, the detected command may have a property that restricts its use to a specific type of item, and action 18 may respond by selecting as targets only those items of the certain type, or by sorting targets of the certain type so that they appear first in the list of targets. As another example, the detected command may comprise a command to define a new item in the circuit, and the targets may be sorted in an order based upon at least one characteristic of the new item, such as the item's processing layer. As yet another example, the detected command may be a command to add a ruler, and the targets may be sorted in the following order: edges, centerlines, vertices, and nexuses. As an example of context sensitivity, the detected command may pertain to defining a ruler in the circuit, and the context may pertain to placing the second point of the ruler after the first point has been established; in this case, action 18 may select edges of various objects as the targets for the second point, and may further sort the edge targets such that those edge targets that are perpendicular to the motion of the input cursor (relative to the first point of the ruler) appear first in the target list. The targets may be further sorted in order of proximity to the cursor (e.g., perpendicular edges appear first in the list in order of closest proximity to the cursor, and horizontal edges appear second in the list in order of closest proximity to the cursor).

Accordingly, action 18 may select and/or sort targets based on one or more of: (i) distance to the input cursor, (ii) relevancy to the detected command, (iii) one or more characteristics of the targets, (iv) on at least one characteristic of a new item being created in the circuit and the relevancy of the characteristics of the targets to the at least one characteristic of the new item, (v) one or more customizable user settings for the detected command, (vi) one or more customizable global user settings applicable to a plurality of commands (e.g., setting for the editing environment).

Method 10 further comprises an action 20 of presenting one or more of the targets to the user for selection. The presentation may comprise one or more forms, as illustrated below. In one form, a listing of targets may be presented to the user in a text box on the screen, which may move across the display canvas with the motion of the input cursor, and a cursor input may be used by the user to select one of the targets. In instances where only one suitable target is present within the set, action 20 may simply display the target and wait for a primary input from the user (e.g., an index-finger mouse click) to select the target. In instances where the set contains more than one suitable target, action 20 may highlight each target in the target list one at a time, in the order provided by action 18, moving from the current highlighted target to the next in the list in response to receiving a secondary input from the user, and further cycling back to the beginning of the list when reaching the end of the list. The secondary input may comprise the pressing of the "Tab" key on a keyboard, the spacebar on the keyboard, another key, or a combination of inputs from one or more input devices (e.g., keyboard, mouse). The user may then issue a primary input (e.g., an index-finger mouse click) to select the highlighted target as the target of the detected command to act upon.

Figure 5:
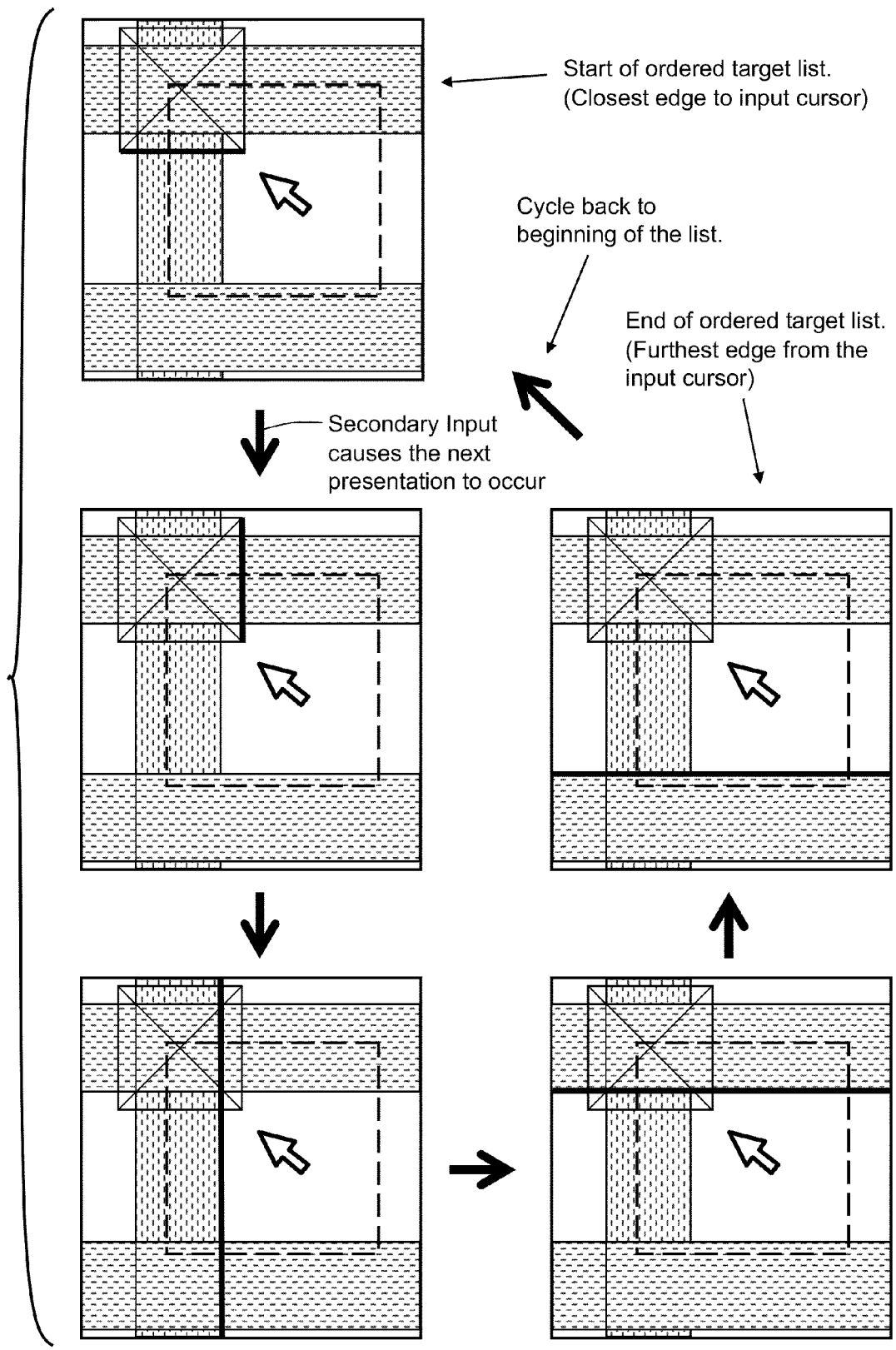

In another presentation form, action 20 may present visual feedback or visual cues on the display canvas to the user to present the targets. For example, presenting a target to the user may comprise altering the appearance of the target or a portion of the target (such as an edge of a target) on the display canvas. The altered appearance may comprise changing the color, brightness, shading, line pattern, and/or size of the item or portion thereof. All of the targets may be altered one at a time in this manner, or only one or a few closest to the input cursor may be altered. The target closest to the input cursor may also be highlighted to a greater degree than the others, and may be selected in response to the user providing a primary input. Also, only one target may be highlighted or given additional highlighting compared to the other targets, and action 20 may further comprise processing each target in the target list in this manner one at a time, in the order provided by action 18, moving from the current highlighted target to the next in the cyclic list in response to receiving a secondary input from the user, and cycling back to the beginning of the list when reaching the end of the list. An illustration of this is provided by the sequence of five screen shots of the display canvas shown in FIG. 5, where the list of targets provided by action 18 comprises just the edge items from FIG. 3 (such as for a ruler command), and where the edge items have been sorted according to nearest distance to the input cursor. Each screen shot shows a presentation of one of the edges being highlighted to the user, and the user is able to move from one presentation to the next, and to move from the end of the list back to the beginning of the list, by issuing a secondary input. As before, the secondary input may comprise the pressing of the "Tab" key, the spacebar on the keyboard, another key, or a combination of inputs from one or more input devices (e.g., keyboard, mouse). The user may then issue a primary input (e.g., an index-finger mouse click) to select the highlighted target as the target for the detected command to use.

As indicated above, the input cursor and the aperture are moveable within the display canvas. Each of actions 16 and 18 may be repeated on a periodic basis, may be repeated when the position of the input cursor and aperture has changed by a selected amount, may be repeated when the position of the input cursor has changed by a selected amount and the elapsed time from the last execution of the action exceeds a selected amount, may be repeated based on another criterion, or may be repeated based on a combination of the above criteria. Action 20 may be updated with new targets in response to a repetition of action 18, and may be repeated until a selection of a target is made by the user.

Referring back to FIG. 1, method 10 further comprises action 22 of receiving the user's selection of a target, such as by receiving a primary input from the user (e.g., index-finger mouse click). Depending upon the detected command (the command being executed), action 22 may further comprise moving the input cursor to a position of a portion of the currently highlighted target when the primary input is received, without the user moving the input device that the user normally uses to move the input cursor (e.g., the mouse). This further action presents a visual "snapping" motion effect to the user that confirms the selection to the user. It is also useful in some commands, such as the ruler command and path creation command, where a newly created item is intended by the user to abut against the highlighted target.

Method 10 further comprises an action 24 of continuing the execution of the detected command with the selected target. Method 10 may further comprise an action 26 of determining if the input of an additional target is desired for the detected command. If so, method 10 may return to one of actions 12 or 14, and may repeat this action through to action 26. If not, method 10 may finish, to be repeated again for another command.

Figure 6:
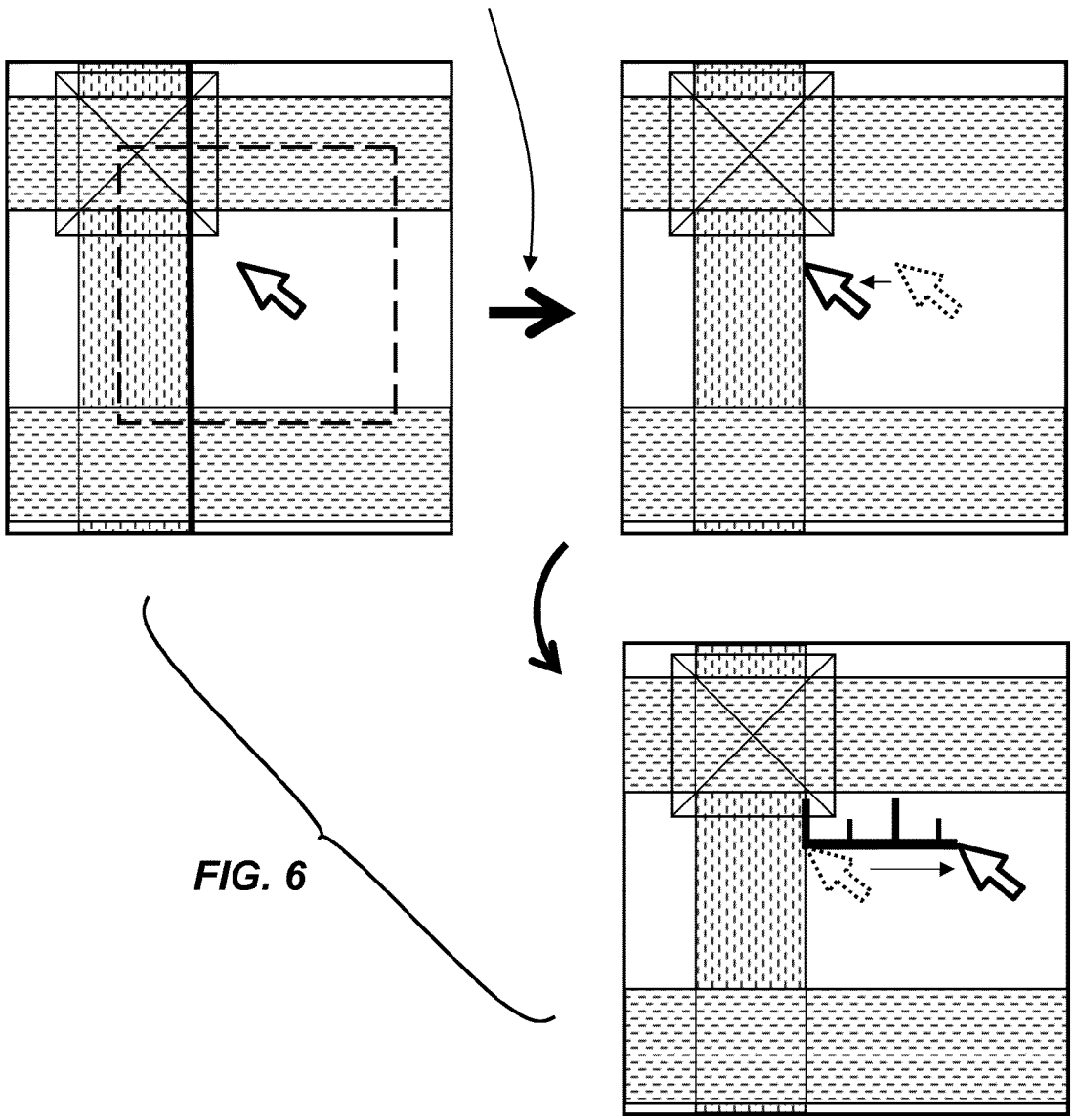

The above-described snapping-motion effect of action 22 is illustrated in the sequence of three screen shots shown in FIG. 6, which pertains to a ruler command. In the first screen shot at the upper left of FIG. 6, one of the targets for the start point of the ruler is presented to the user. The user may then issue a primary input (e.g., index-finger click) to select that target, which causes the second screen shot at the upper right of FIG. 6 to be presented to the user. In the second screen shot, the input cursor has been moved by the method (not the user) to a point on the highlighted target, which is now the selected target. The point on the selected target may be the closest point of the target to the prior location of the input cursor (e.g., the input cursor is snapped along a path with the shortest distance from the prior position of the input cursor to the highlighted target). The user can then move the input cursor to the second point of the ruler, which is illustrated in the third screen shot, and is now part of action 24 of method 10 (shown in FIG. 1). The ruler command can draw segments of the ruler as the user moves the input cursor. Action 26 of method 10 may then be used to reiterate actions 14-24 or 16-24 to obtain a target for the second point of the ruler.

Figure 7:
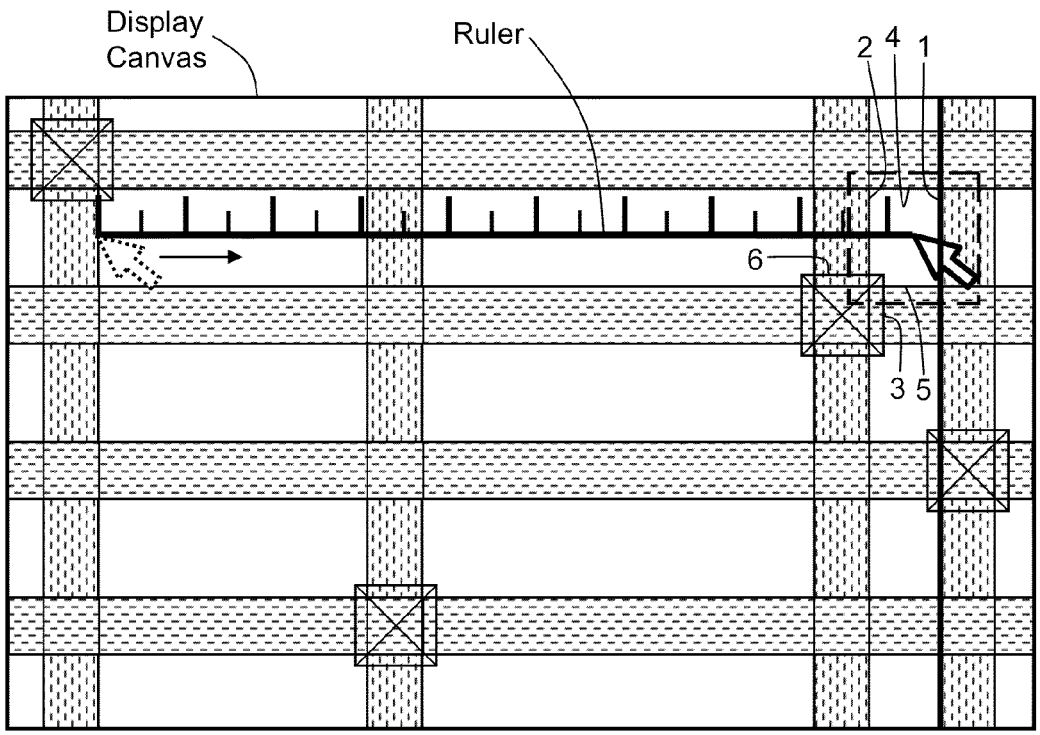

FIG. 7 is a screen shot of the display canvas illustrating the execution of an exemplary ruler command, where the user is in the process of placing the second point of the ruler in a congested environment, and where the user has configured the ruler command to only measure between edges. The result of the reiteration of actions 16 and 18 of method 10 for the second point of the ruler is a set of six targets, as indicated by reference number 1-6 in the figures. These reference numbers indicate the order in which the targets were sorted in the target list by action 18, with reference number 1 being the first target in the list, and reference number 6 being the last. The first target in the list is highlighted by action 20, and the user may cycle through the list of targets by giving secondary inputs (e.g., hitting the space bar on the keyboard), as described above. This enables the user to select the desired edge without the need for zooming in on the display canvas in the area of the ruler's second point. The edges in the target list are sorted according to their proximity to the input cursor, and addition- ally sorted by orientation with respect to the movement of the input cursor from the first point of the ruler to the current point. In this case, the edge targets that have a perpendicular orientation with respect to the motion of the input cursor are sorted to appear in the list before the edge targets that have a parallel orientation with respect to the motion of the input cursor. With the two sorting operations, which may occur in any order, the vertical (perpendicular) edge targets appear first in the target list in order of closest proximity to the cursor, and the horizontal (parallel) edge targets appear second in the list in order of closest proximity to the cursor since the ruler has a horizontal orientation.

Figure 8:
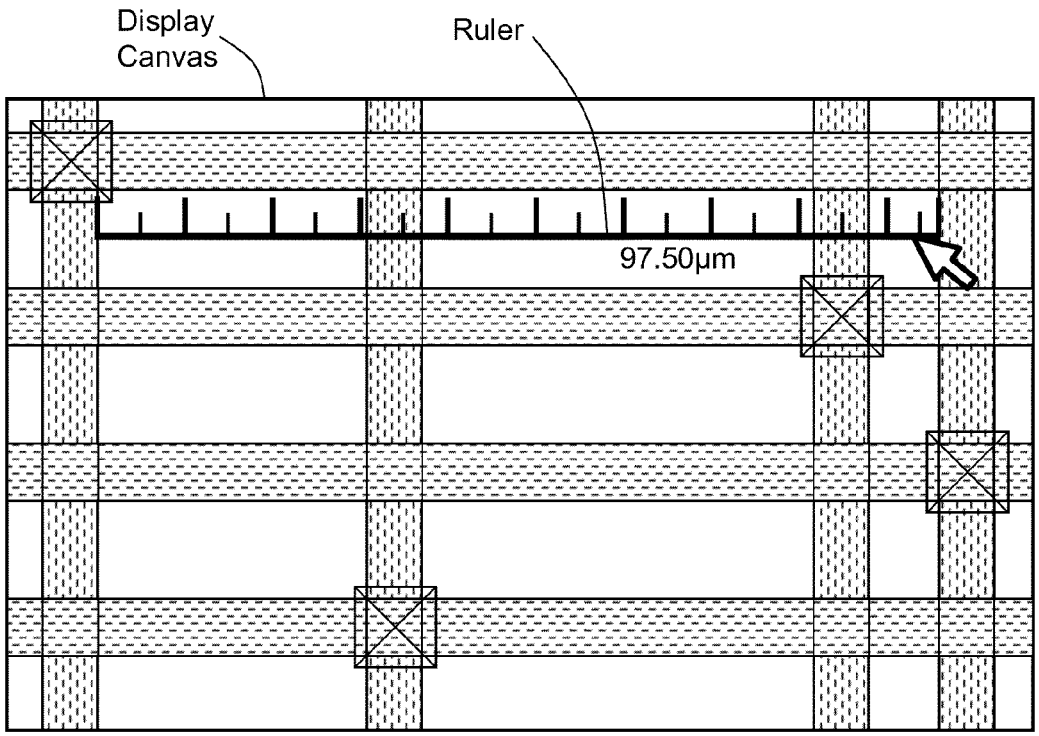

Once the user sees the desired target highlighted by action 20 of method 10, the user may issue a primary input (e.g., index-finger mouse click), and the ruler command will fix the second point on a point of the selected target without the user moving the input cursor to that point of the selected target. The ruler command may be configured to have angular orientations that are restricted to certain degrees, such as horizontal (0 degrees), vertical (90 degrees), 45 degrees, and −45 degrees; or may be configured to have any angular orientation. When the ruler's angular orientation is unrestricted, the above point of the selected target may be the point nearest to the input cursor, or may be the nearest point that lies on the line passing through the first point of the ruler and the current position of the input cursor. When the ruler's angular orientation is restricted, the above point of the selected target can be the nearest point that is along the nearest restricted angular orientation for the ruler. FIG. 8 shows the result of the user's selection of the highlighted target. Note that the second point of the ruler has been placed at the highlighted target without the user moving the input cursor to the target, and a distance notation has been placed next to the ruler.

As is well known in the semiconductor manufacturing art, a circuit layout comprises a plurality of layers of patterns to be formed in corresponding material layers (e.g., diffusion, via in dielectric layer-1, metal-1, via in dielectric layer-2, metal-2, etc.) of a semiconductor manufacturing process. In order to ensure that the patterns are correctly formed by the process, the patterns should conform to a set of design rules. Typical design rules include, but are not limited to, minimum dimensions for the patterns in each layer, and minimum separation distances between separate patterns formed in the same layer, minimum separation distances for patterns formed in adjacent layers, minimum overlap dimensions for patterns formed in adjacent layers that are to be coupled by a via, etc. Typically, but not necessarily, a grid array for the circuit layout is established beforehand, and the layout objects are placed in the layout so that their edges and vertices fall on grid points of the grid array. A typical circuit layout editor has a concurrent design-rule checking (DRC) facility that a user can call upon dynamically on-the-fly during editing a circuit layout to check the layout (or a portion thereof) for violations of the design rules. The DRC facility can also be run after the circuit layout (or portion thereof) has been finished. In that case, if violations are found, the user edits the circuit layout to move layout objects to satisfy the design rules, and then reruns the DRC facility to ensure that the revised layout is good. Oftentimes, re-editing a circuit layout to fix one DRC violation unintentionally creates another DRC violation. For this reason, circuit designers prefer to use the concurrent DRC facility which takes care of reporting any DRC errors on the fly during editing of the layout.

In further implementations of method 10, one or more of the targets selected by action 18 and presented to the user by action 20 may comprise allowable locations that a selected item can be moved to without violating a set of design rules.

In addition, action 18 may only select the items collected by action 16 that a selected item can be moved to without violating a set of design rules. Thus, the targets presented to the user by action 20 can take into account information from the DRC engine. These further features enable the designer to edit objects so that they conform to the design rules from the start, thereby significantly reducing the possibility of DRC violations being found in the completed circuit when the DRC facility is run. To implement this, action 18 may be further augmented to determine if the present task of the detected command relates to moving or stretching an item, such as a layout object or a stretch handle, edge, nexus, or vertex, etc. of a layout object. If so, action 18 further determines a plurality of allowable locations within the aperture that the "moving" item can be moved to without violating the design rules. To accomplish the latter determination, action 18 can determine the locations of grid points within the aperture, collect the layout objects that are partially or wholly within a small area around the input cursor (the small area typically being somewhat larger than the aperture), determine a list of possible locations on the grid points that the "moving" item can be placed, and then use a DRC engine to check these possible locations against the collected objects to determine which of the possible locations are actually allowable under the design rules. The allowable locations are then added to the list of targets generated by action 18, and provided to presentation action 20. The allowable locations may be presented to the user by snapping the input cursor to the allowable location and/or drawing a ghost image of the item on the screen. As a further feature, any other target selected by action 18 may be checked by the DRC engine in a similar manner, and removed if they are not at allowable locations.

Figure 9:
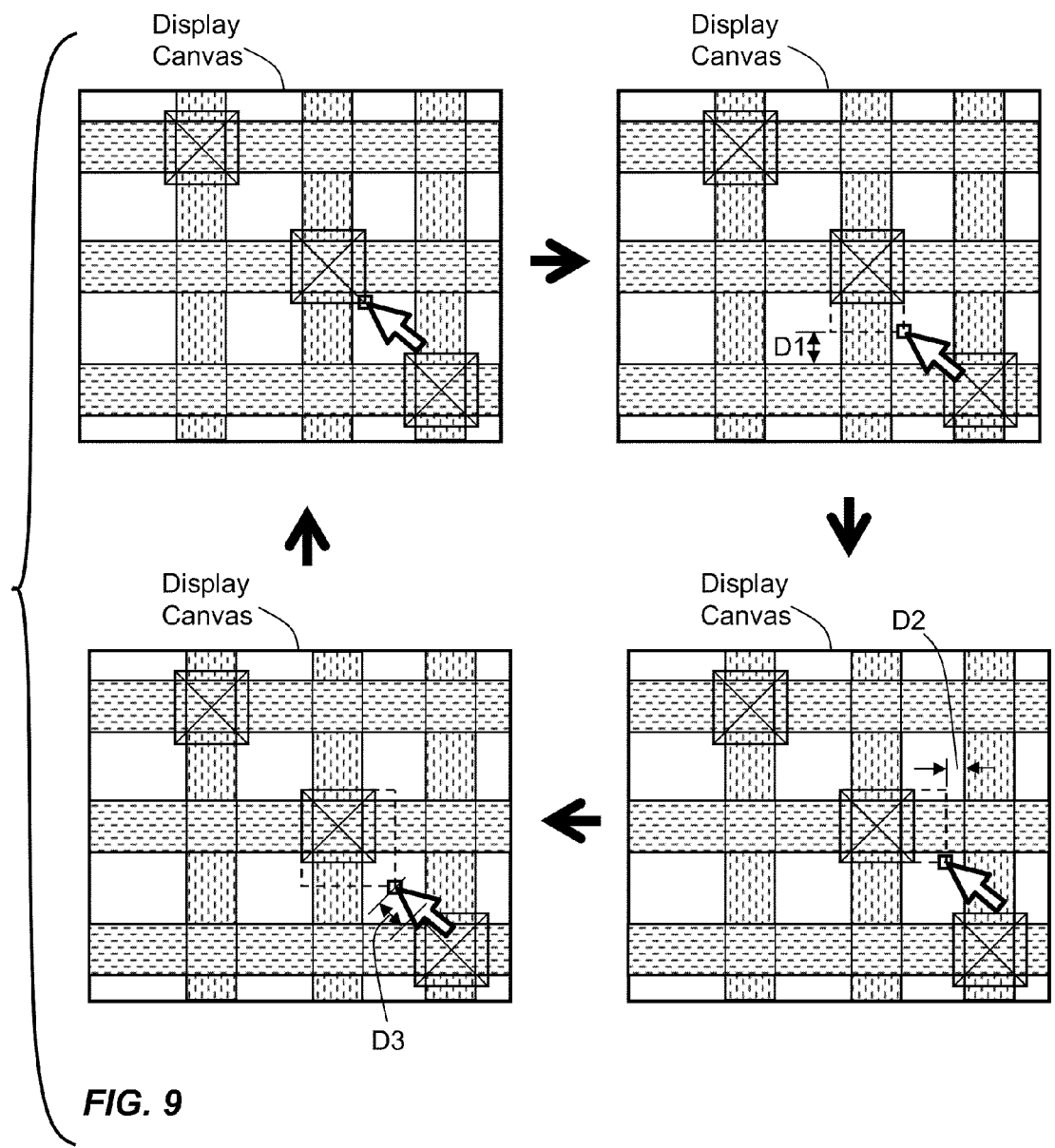

An illustration of this is provided by the sequence of four screen shots of the display canvas shown in FIG. 9, where the lower right vertex of a central via is being moved. This via is configured as a P-cell (parameterized cell) which has a stretch handle on its lower right vertex. As background, the stretch handles of a P-cell usually have the callbacks (in a specific language, such as SKILL) associated with them which configure the shape of the P-cell by manipulating its parameters based on the motion of the cursor after moving the stretch handle after selection. (Usually, the associated callbacks do not have knowledge of the objects in the vicinity of the P-cell.) In conventional layout editors, the selection of stretch handles for stretching a P-cell's shape is sometimes considered a usability issue since the P-cell's stretch handles are significantly smaller than other objects in the layout (such as edges and vertices), and are therefore harder for the user to select in those conventional layout editors over other objects. To address this issue, action 18 may be configured in a context sensitive manner to give precedence to P-cell stretch handles in the collected items whenever the user is executing a stretching command, so that they can be presented first for selection by action 20. Continuing with the initial discussion of FIG. 9 where the lower right vertex (having the stretch handle on it) of the central via is being moved, both the vertex (stretch handle) and the central via are items, with the vertex being the "moving" item, and being related to the central via as one of the via's vertices. In the upper left screen shot, the user has selected the lower right vertex of the via for a movement operation, and has positioned the input cursor over the initial location of the vertex. In the upper right screen shot, the user has moved the input cursor down from the vertex's initial location through a series of allowable locations until the input cursor reaches a distance D1 from a horizontal metal-1 line, where distance D1 is reflective of a design rule (e.g., minimum spacing distance between via and adjacent metal-1 pattern). At this point, the allowed location of the vertex is illustrated to the user; as a further feature, a dashed outline or ghost image of the central via under this movement may also be illustrated to the user. In the lower right screen shot of FIG. 9, the user has moved the input cursor to the right from the vertex's initial location through a series of allowable locations until the input cursor reaches a distance D2 from a vertical metal-2 line, where distance D2 is reflective of another design rule (e.g., minimum spacing distance between via and adjacent metal-2 pattern). At this point, the allowed location of the vertex is illustrated to the user; as a further feature, a dashed outline or ghost image of the central via under this movement may also be illustrated to the user. In the lower left screen shot of FIG. 9, the user has moved the input cursor down and to the right from the vertex's initial location through a series of allowable locations until the input cursor reaches a distance D3 from another via, where distance D3 is reflective of another design rule (e.g., minimum spacing distance between adjacent vias between metal-1 and metal-2). At this point, the allowed location of the vertex is illustrated to the user; as a further feature, a dashed outline or ghost image of the central via under this movement may also be illustrated to the user. As a further feature, the user may provide a series of secondary inputs to cause action 20 to sequence through the presentations of the allowable locations along with presentations of the other targets in the same manner as described above with reference to FIG. 5. This enables the user to move the item at a higher altitude than that which would normally be used. As before, the secondary input may comprise the pressing of the "Tab" key, the spacebar on the keyboard, another key, or a combination of inputs from one or more input devices (e.g., keyboard, mouse). The user may then issue a primary input (e.g., an index-finger mouse click) to select the highlighted target as the target for the detected command to use.

It may be appreciated that the determination and display of allowable locations for an item may be used with any command that modifies the position, size, shape, or other characteristic of an item. Typically, the use of the DRC engine by action 18 and the presentation of allowable locations by action 20 occur during the second or subsequent iteration of actions 18 and 20 of the application of method 10 for the detected command. For example, the user first issues a move or stretch command that is detected by action 12, and the particular item to be moved or stretched is found with the first iteration of actions 16-22. Then, with the input cursor placed at the location of the selected item to be moved (e.g., the "moving" item), actions 16-22 may be reiterated to find the location to where the selected item is to be moved. During the reiteration of actions 18 and 20, the above determination and presentation of allowable locations may be performed, as described above. As another option, step 20 of method 10 may be augmented to include the above-described actions used in determining and presenting the allowable locations to the user, in which case the other targets found by action 18 are not presented to the user. In this implementation, instances of actions 14 and 16 may be used to collect the objects used by the DRC engine to find the allowable locations.

While limiting the placements of objects and object features to allowable design-rule locations and image ghosting are available commercial circuit editors, embodiments of the present invention are the first to integrate these facilities with the above-described high-altitude editing facilities that collect, select, sort, and present targets to the user. Thus, the analysis provided by the DRC engine is interfaced with the selection of targets and locations used by editing commands, which boosts layout productivity for the circuit designer, particularly when using the cyclic presentation of targets and allowable locations by way of the secondary inputs (e.g., tab key, spacebar) in action 20, as described above.

In another exemplary implementation, method 10 can be used with a command to create a wire in a layout. The wire may comprise of a layout object, such as a path, a path segment, etc. In a typical wire editing or Point-to-Point routing application, when the user clicks on the starting point of the wire, the layer of the wire is automatically selected depending on the layer of the underlying shape below that point. However, if the starting point of click has multiple (two or more) overlapped shapes below it, there is usually a pop-up window which presents all the unique layers of the overlapped shapes/objects and asks the user to pick one of them as starting point to select the object from which it can tap/choose the layer of the wire under construction. This is a bit time consuming as it involves an additional pop-up dialog window and involved multiple clicks. This selection process can be improved using method 10. We may use action 18 (relevant to the Create Wire command) to select one or more of such overlapped targets and present to the user by action 20 which may comprise of allowable shapes sorted in a specific intelligent order (e.g., depending on the command requirements, user settings, currently active layer, such as giving precedence to an object on a layer closest to the active layer or any other heuristics related to the active command; or use one or more characteristics of the item being created with respect to the collected items within the layout aperture). So, when a user starts the Create Wire command and moves the input cursor, the shapes found fully or partially in the aperture (or just overlapping the mouse cursor, such as with a small or near zero sized aperture) will be collected and presented to the user by highlighting the target fully or partially. Action 18 and 20 may be used to pick the highlighted target or even cycle through the overlapped targets with a secondary input (e.g., Tab key, Spacebar, etc.). Once the target is selected, the user clicks on the first point of the wire which will tap the shape from the currently presented layout object/shape.

Figure 10A:
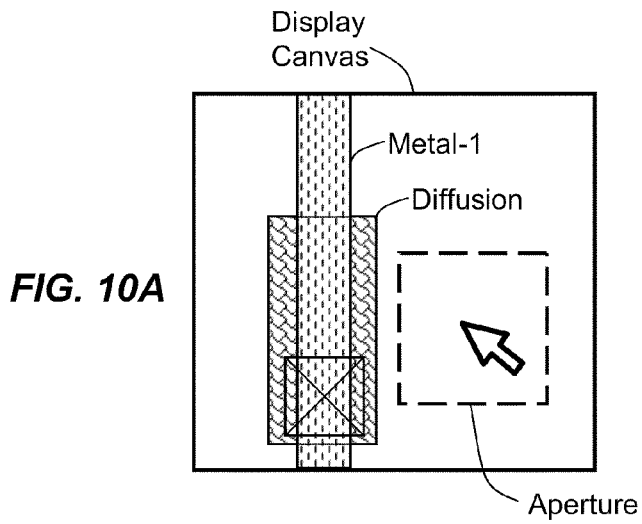
Figure 10B:
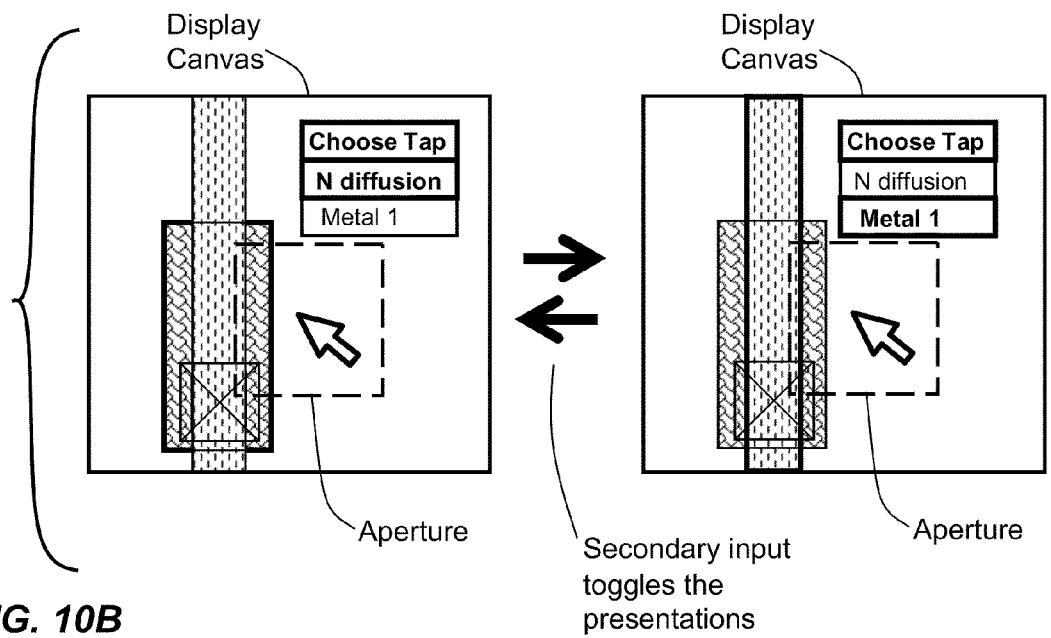
Figure 10C:
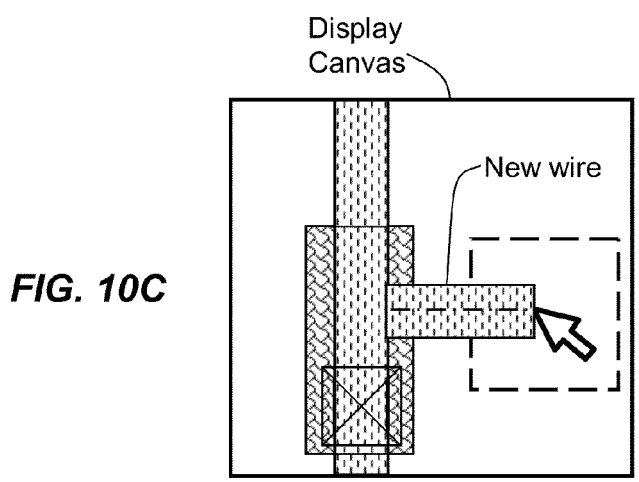

An illustration of this is provided by the sequence of screen shots of the display canvas shown in FIGS. 10A-10C. FIG. 10A shows the display canvas after the Create Wire command have been given and detected by method 10, and as the user is moving the input cursor toward a structure that has diffusion polygon, a metal-1 polygon overlying part of the diffusion polygon, and via that couples the diffusion and metal-1 polygons together. Such a structure involving diffusion and metal overlap is a typical geometry found in a MOS device layout, while there can be numerous other examples of overlapping shapes on different layers in a layout. FIG. 10B shows the display canvas when the user has moved the input cursor close enough to the structure that the aperture covers portions of the diffusion and metal-1 polygons. Action 16 has collected the two polygons as items, and action 18 has selected them as targets and ordered them in a list. Action 20 can then present the two polygons as targets than can be presented one at a time for selected, and cycled through the list with secondary inputs. This is show in FIG. 10B where the user can toggle between the presentation of the two polygons, and where the heavy lines are used to illustrate the highlighted item. As an option, a pop-up window showing the targets and the currently highlight target may appear next to the input cursor. The highlighted target may be selected by the user giving a primary input (e.g., index-finger click). FIG. 10C shows the display canvas after the user has selected the metal-1 polygon, at which point the Create Wire command initiates the creation of the new wire from the location of the metal-1 polygon that was closest to the input cursor at the time the primary input was given by the user.

Figure 12:
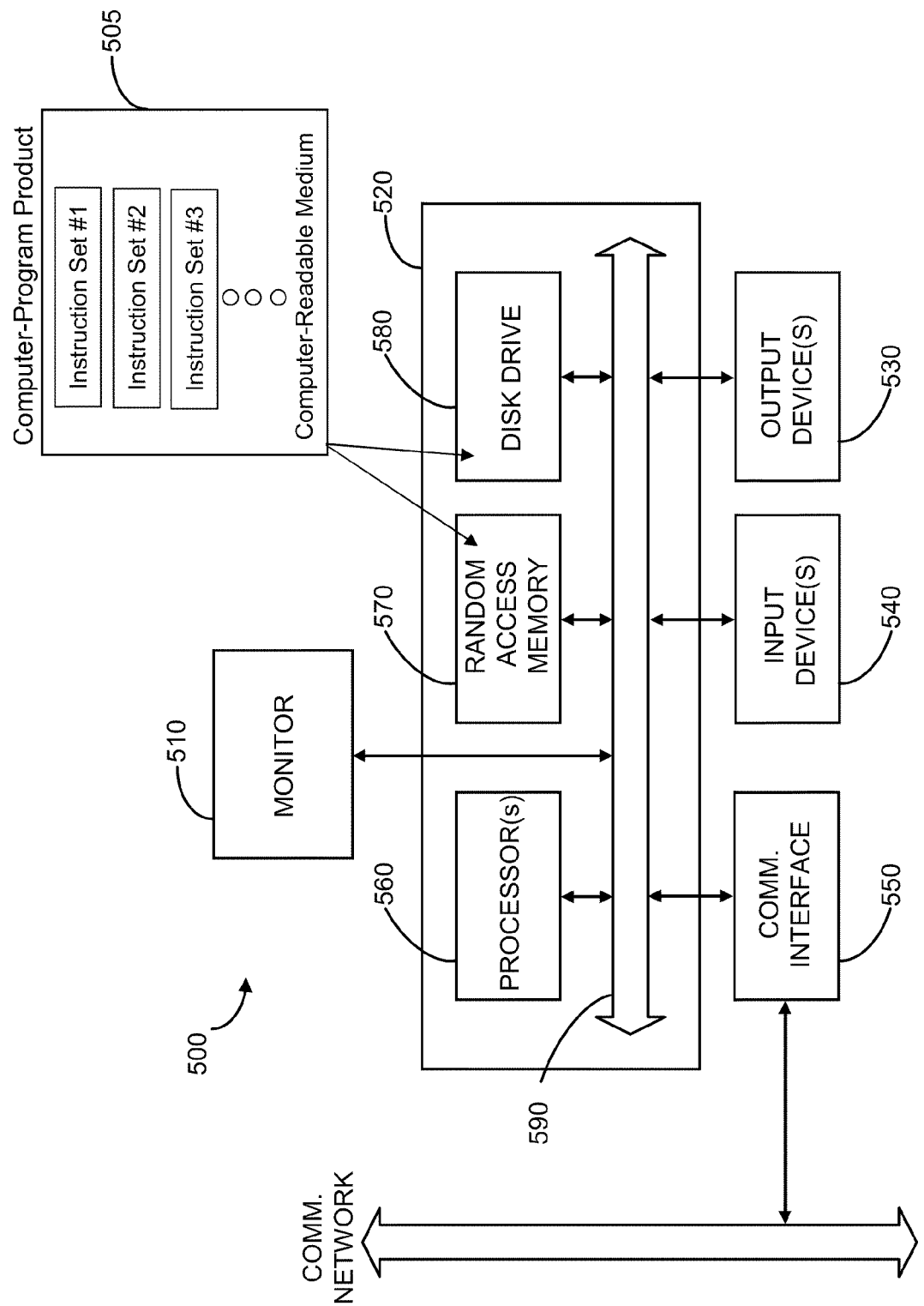
FIG. 12 is a diagram illustrating a computer system that can be used in conjunction with some embodiments of the invention.

Each of the actions of method 10 may be performed using a computer system, such as that shown in FIGS. 12 and/or 13. For example, a computer program product, comprising a computer-usable medium having a computer-readable program code embodied therein, may be provided with its computer-readable program code adapted to be executed to implement method 10. Also, a graphical circuit editor (e.g., editing system) comprising a computer system with a processor and memory running under the direction of the above exemplary computer program product embodiment may be provided.

Figure 11:
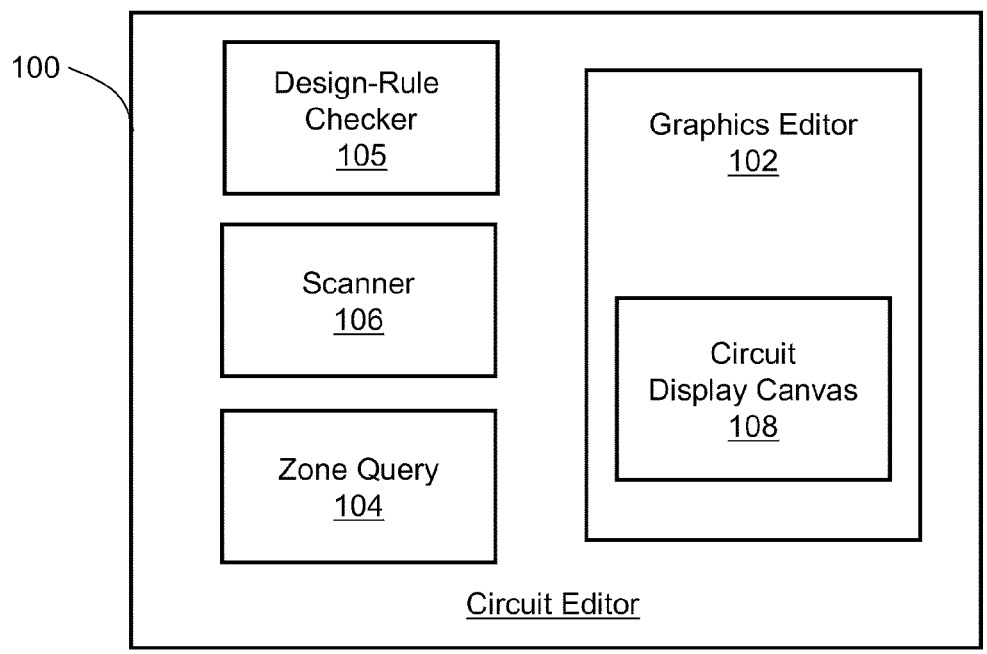
FIG. 11 is a diagram illustrating an exemplary system in accordance with an exemplary embodiment of the present invention.

FIG. 11 is a diagram illustrating a computer aided design (CAD) circuit editor 100 in accordance with an exemplary embodiment of the invention that may implement various or all of the above-described features and aspects of method 10 and its variations. Circuit editor 100 may include a circuit design integrated design environment ("IDE"), which is a type of EDA tool. Circuit editor 100 comprises a graphical editor component 102, a zone query component 104, a design-rule-checking (DRC) component 105, a scanner component 106, and a circuit display canvas component 108, as shown in the figure.

The graphical editor component 102 is configured to visualize circuit designs to the user (e.g., circuit designer) and to provide the designer with a graphical user interface ("GUI") by which commands can be inputted and the design created and modified. The graphical user interface can include an input cursor (such as, for example, a mouse cursor) by which the user can graphically input commands to circuit editor 100. The display canvas component 108 is a component of the graphical editor 102 configured to display the circuit design and to accept commands and selections made to a circuit design displayed within display canvas component 108.

The zone query component 104 is configured to retrieve pertinent information from data storage (such as from a database) about a circuit design currently being displayed in the canvas component 108. In particular, zone query component 104 is capable of retrieving information for specific regions (or "zones") of a circuit design for use by scanner component 106, graphical editor component 102, and DRC engine component 105. Such pertinent information includes, for example, objects and object features that exist in a given region of a circuit design. With respect to objects, some examples can include various shapes and polygons. With regard to object features, some examples include, but are not limited to, the edges, vertices, midpoints, pins, nexuses, and centerlines, as discussed above. The object and object features are items, as described above.

Graphical editor component 102 is configured to implement command detection action 12, target presentation action 20, target selection action 22, and command processing actions 24 and 26 of method 10. Either or both of scanner component 106 and graphical editor component 102 may be configured to implement aperture definition action 14 of method 10. Scanner component 106 is configured to scan the objects and object features collected by zone query component 104 in view of the detected command and the defined aperture, and to implement item collection action 14 and target selection action 16 of method 10. In some embodiments, zone query component 104 may assist in performing collection action 14 by preselecting items for scanner component 106, or may be configured to perform collection action 14 under the direction of scanner component 106. Scanner component 106 may utilize DRC component 105 as needed for its tasks, such as by providing DRC component 105 with a collection of existing items in a neighborhood around the potential placement area for another item (e.g., a new item or a stretch handle of an existing item, etc.), and DRC component 105 may provide scanner component 106 with a list of acceptable placement locations that scanner component 106 may use as targets. The targets selected by scanner component 106 are provided to graphical editor component 102 for presentation to the user (e.g., circuit designer). As one example where a context-sensitive command is being applied to the edges of objects, zone query component 104 may provide scanner component 106 with all the edges shown by canvas component 108, and scanner component 106 may select those edges that are within the defined aperture around the input cursor for its tasks of generating a list of targets for presentation to the user, as described above with regard to method 10. In order to speed up information gathering, scanner component 106 and/or zone query component 104, can cache item data as it is gathered. Graphic editor component 102 may then present the selected targets to the user using display boxes and/or visual cues, as described above with regard to method 10. A presented target can be displayed as a preview of the outcome of selecting the target, before the presented target is actually chosen. For example, for a move command, once an object has been selected, a ghost image of the object may be displayed at the locations of various targets in response to the user's movement of the input cursor moving close to those targets.

As used herein, the term "component" encompasses a unit of functionality that can be performed in accordance with one or more embodiments of the present invention. Each component described herein may be implemented utilizing any form of hardware, software, or a combination thereof. For example, one or more processors, controllers, ASICs, PLAs, logical components, software routines or other mechanisms may be used to implement a component. The various components described herein may be implemented as discrete components, or the functions and features described can be shared in part or in whole among one or more components. As will be apparent to one of ordinary skill in the art after reading the present application, the various features and functionality described herein may be implemented in any given application, and may be implemented in one or more separate or shared components in various combinations and permutations. Even though various features or elements of functionality may be individually described or claimed as separate components or elements of components, one of ordinary skill in the art will understand that these features and functionality can be shared among one or more common software and hardware elements, and such description shall not require or imply that separate hardware or software components are used to implement such features or functionality.

The above method embodiments may be implemented by computer-program products that direct a computer system to perform the actions of the above-described methods and components. Each such computer-program product may comprise sets of instructions (codes) embodied on a computer-readable medium that directs the processor of a computer system to perform corresponding actions. The instructions may be configured to run in sequential order, or in parallel (such as under different processing threads), or in a combination thereof. FIG. 12 shows a simplified block diagram of a computer system 500 that may incorporate embodiments of the present invention. FIG. 12 is merely illustrative of an embodiment incorporating the present invention and does not limit the scope of the invention as recited in the claims. One of ordinary skill in the art would recognize other variations, modifications, and alternatives. System 500 comprises a computer 520, a monitor 510 coupled to computer 520, one or more additional user output devices 530 (optional) coupled to computer 520, one or more user input devices 540 (e.g., keyboard, mouse, track ball, touch screen) coupled to computer 520, an optional communications interface 550 coupled to computer 520, a computer-program product 505 stored in a tangible computer-readable memory in computer 520. Computer-program product 505 directs system 500 to perform the above-described actions of method 10 and circuit editor 100. Computer 520 may include one or more processors 560 that communicate with a number of peripheral devices via a bus subsystem 590. These peripheral devices may include user output device(s) 530, user input device(s) 540, communications interface 550, and a storage subsystem, such as random access memory (RAM) 570 and disk drive 580, which are forms of tangible computer-readable memory. Computer-program product 505 may be stored in disk drive 580, or another computer-readable medium accessible to computer 520, and loaded into memory 570. Each processor 560 may comprise a microprocessor, such as a Pentium® or Itanium® microprocessor from Intel, or an Opteron® or AthlonXP® microprocessor from Advanced Micro Devices, Inc, or the like. To support computer-program product 505, computer 520 runs an operating system that handles the communications of product 505 with the above-noted components, as well as the communications between the above-noted components in support of product 505. Exemplary operating systems include Windows®, WindowsXP®, WindowsNT®, or the like from Microsoft Corporation, Solaris® from Sun Microsystems, LINUX, UNIX, and the like.

User input devices 540 include all possible types of devices and mechanisms for inputting information to computer system 520. These may include a keyboard, a keypad, a touch screen incorporated into the display, audio input devices such as voice recognition systems, microphones, and other types of input devices. In various embodiments, user input devices 540 are typically embodied as a computer mouse, a trackball, a track pad, a joystick, wireless remote, a drawing tablet, a voice command system. User input devices 540 typically allow a user to select objects, icons, text and the like that appear on the monitor 510 via a command such as a click of a button or the like. User output devices 530 include all possible types of devices and mechanisms for outputting information from computer 520. These may include a display (e.g., monitor 510), non-visual displays such as audio output devices, etc.

Communications interface 550 provides an interface to other communication networks and devices, and may serve as an interface for receiving data from and transmitting data to other systems. Embodiments of communications interface 550 typically include an Ethernet card, a modem (telephone, satellite, cable, ISDN), (asynchronous) digital subscriber line (DSL) unit, FireWire interface, USB interface, and the like. For example, communications interface 550 may be coupled to a computer network, to a FireWire bus, or the like. In other embodiments, communications interface 550 may be physically integrated on the motherboard of computer 520, and may be a software program, such as soft DSL, or the like.

RAM 570 and disk drive 580 are examples of tangible computer-readable media configured to store data such as computer-program product embodiments of the present invention, including executable computer code, human-readable code, or the like. Other types of tangible computer-readable media include floppy disks, removable hard disks, optical storage media such as CD-ROMS, DVDs and bar codes, semiconductor memories such as flash memories, read-only-memories (ROMS), battery-backed volatile memories, networked storage devices, and the like. RAM 570 and disk drive 580 may be configured to store the basic programming and data constructs that provide the functionality of various embodiments of the present invention, as described above. Specifically, software instruction sets that provide the functionality of the present invention may be stored in RAM 570 and disk drive 580. These instruction sets may be executed by processor(s) 560. RAM 570 and disk drive 580 may also provide a repository for storing data and data structures used in accordance with the present invention. RAM 570 and disk drive 580 may include a number of memories including a main random access memory (RAM) for storage of instructions and data during program execution and a read-only memory (ROM) in which fixed instructions are stored. RAM 570 and disk drive 580 may include a file storage subsystem providing persistent (non-volatile) storage for program and data files. RAM 570 and disk drive 580 may also include removable storage systems, such as removable flash memory.

Bus subsystem 590 provides a mechanism for letting the various components and subsystems of computer 520 communicate with each other as intended. Although bus subsystem 590 is shown schematically as a single bus, alternative embodiments of the bus subsystem may utilize multiple busses.

Where the performance of an action of any of the methods disclosed herein is not predicated on the completion of another action, the actions may be performed in any time sequence (e.g., time order) with respect to one another, including simultaneous performance and interleaved performance of various actions. (Interleaved performance may, for example, occur when parts of two or more actions are performed in a mixed fashion.) For example, two or more of the actions of method 10 may be run simultaneously or in an interleaved manner by separate respective processing threads running on system 500. Yet further examples exist, but are not listed here. Accordingly, it may be appreciated that, while the method claims of the present application recite sets of actions, the method claims are not limited to the order of the actions listed in the claim language, but instead cover all of the above possible orderings, including simultaneous and interleaving performance of actions and other possible orderings not explicitly described above, unless otherwise specified by the claim language (such as by explicitly stating that one action proceeds or follows another action).

The specification and drawings are, accordingly, to be regarded in an illustrative rather than a restrictive sense. It will be evident that various modifications and changes may be made thereunto without departing from the broader spirit and scope of the invention as set forth in the claims. In addition, the techniques, methods, computer-program products, and systems of the present invention are suitable for use with a wide variety of EDA tools and methodologies therefor for checking, verifying, editing, revising, and fixing circuit layouts.

The scope of the invention should, therefore, be determined not with reference to the above description, but instead should be determined with reference to the pending claims along with their full scope or equivalents.

What is claimed is:

1. A method for a graphical circuit editor that represents a circuit within a layout space, the method comprising:
   detecting, in a computer, a command from a user of a graphical circuit editor;
   defining an aperture in the circuit for an input cursor, wherein the aperture is an area of the circuit layout space that encompasses one or more circuit objects and the location of the input cursor in the circuit layout space, wherein the input cursor and the aperture are moveable within the circuit layout space, and wherein the location of the aperture moves in relation to the movement of the input cursor;
   collecting a set of items of the one or more circuit objects, each item being at least partly located within the aperture and associated with the circuit;
   selecting one or more items from the set as one or more targets suitable for the command to operate upon based upon one or more of: a relevancy to the detected command or one or more item types previously selected by the user or one or more customizable user settings for the detected command; and
   presenting one or more of the targets to the user for selection.

2. The method of claim 1, wherein an item comprises one of:
   a layout object, an edge of a layout object, a vertex of a layout object, an end of a layout object, a midpoint of a layout object, a centerline of a layout object, a nexus of a layout object, a handle of a layout object, a placement or stretch location for a layout object allowed under a design-rule checker, a schematic object, an edge of a schematic object, a vertex of a schematic object, an end of a schematic object, a nexus of a schematic object, or a handle of a schematic object.

3. The method of claim 1, wherein the dimensions of the aperture are selectable by the user.

4. The method of claim 1, wherein the detected command is one of: a command to define a new item in the circuit; a command to modify the position, size, shape, or another characteristic of an item; a command to stretch a dimension of an item; or a command to define a ruler or marker in the circuit.

5. The method of claim 1, wherein collecting the set of items comprises updating the set with a movement of the aperture, and wherein selecting one or more items as one or more targets comprises updating the selection with a change in the set.

6. The method of claim 1, wherein each of the recited actions is performed using the computer system.

7. The method of claim 1, wherein collecting the set of items comprises collecting items based upon one or more of:
   (i) relevancy to the detected command,
   (ii) one or more item types previously selected by the user,
   (iii) one or more characteristics of the items,
   (iv) on at least one characteristic of a new item being created in the circuit and the relevancy of the characteristics of the items in the aperture to the at least one characteristic of the new item,
   (v) one or more customizable user settings for the detected command,
   (vi) one or more customizable global user settings applicable to a plurality of commands.

8. The method of claim 1, wherein selecting the one or more items as one or more targets comprises selecting items based upon their relevancy to the detected command.

9. The method of claim 1, wherein presenting one or more of the targets to the user for selection comprises presenting one of the targets at a time to the user, and wherein the method further comprises receiving an input from the user to select the presented target and, in response thereto, moving the input cursor to a position of a portion of the presented target.

10. The method of claim 9, wherein presenting one of the targets to the user comprises altering the appearance of at least a portion of the target.

11. The method of claim 1, wherein presenting the targets to the user comprises:
arranging the targets in an order;
presenting one of the targets to the user; and
receiving an input from the user to present the next target in the order and, in response thereto, presenting the next target to the user.

12. The method of claim 11, wherein presenting a target comprises altering the appearance of at least a portion of the target.

13. The method of claim 11, wherein arranging the targets in an order comprises arranging the targets based upon one or more of:
(i) distance to the input cursor,
(ii) relevancy to the detected command,
(iii) one or more characteristics of the targets,
(iv) on at least one characteristic of a new item being created in the circuit and the relevancy of the characteristics of the targets to the at least one characteristic of the new item,
(v) one or more customizable user settings for the detected command,
(vi) one or more customizable global user settings applicable to a plurality of commands.

14. The method of claim 1, further comprising:
receiving an input from the user to select a presented target and, in response thereto, selecting a point of the selected target as a first item usable by the detected command.

15. The method of claim 14, further comprising:
defining another aperture for the input cursor, the other aperture being a second area of the layout space that encompasses the location of the input cursor in the layout space;
collecting a second set of items, each item being at least partly located within said other aperture and associated with the circuit;
selecting one or more items from the second set as one or more second targets suitable for the command to operate upon; and
presenting one or more of the second targets to the user for selection.

16. The method of claim 15, wherein presenting the second targets comprises:
arranging the second targets in an order of presentation;
presenting one of the second targets to the user; and
receiving an input from the user to present the next second target in the order of presentation and presenting said next second target to the user.

17. The method of claim 15, wherein presenting a second target comprises altering the appearance of at least a portion of the second target.

18. The method of claim 15, further comprising detecting a direction of cursor motion; and
wherein arranging the second targets in an order of presentation comprises ordering each second target based on the orientation of a feature of the second target with respect to the detected direction of cursor motion.

19. The method of claim 14, wherein the selected target is an object, an edge of an object, a stretch handle of an object, a nexus of an object, or a vertex of an object;
wherein the detected command comprises a command to modify the position, size, shape, or other characteristic of an object related to the selected target by moving the selected target; and wherein the method further comprises determining a plurality of allowable locations that the selected target can be moved to without violating a set of design rules.

20. The method of claim 19, further comprising restricting the motion of the input cursor to the plurality of allowable locations.

21. The method of claim 1, wherein selecting one or more items from the set as one or more targets suitable for the command to operate upon comprises selecting a plurality of items as a plurality of targets suitable for the command to operate upon; and
wherein presenting one or more of the targets to the user for selection comprises presenting a plurality of targets to the user for selection.

22. A computer program product, comprising a non-transitory computer-usable medium having a computer-readable program code embodied therein, said computer-readable program code adapted to be executed to implement a method for circuit editing that represents a circuit within a layout space, said method comprising:
detecting a command from a user of a graphical circuit editor;
defining an aperture in the circuit for an input cursor, wherein the aperture is an area of the circuit layout space that encompasses one or more circuit objects and the location of the input cursor in the circuit layout space, wherein the input cursor and the aperture are moveable within the circuit layout space, and wherein the location of the aperture moves in relation to the movement of the input cursor;
collecting a set of items of the one or more circuit objects, each item being at least partly located within the aperture and associated with the circuit;
selecting one or more items from the set as one or more targets suitable for the detected command to operate upon based upon one or more of: a relevancy to the detected command or one or more item types previously selected by the user or one or more customizable user settings for the detected command; and
presenting one or more of the targets to the user for selection.

23. The computer program product of claim 22, wherein an item comprises one of:
a layout object, an edge of a layout object, a vertex of a layout object, an end of a layout object, a midpoint of a layout object, a centerline of a layout object, a nexus of a layout object, a handle of a layout object, a placement or stretch location for a layout object allowed under a design-rule checker, a schematic object, an edge of a schematic object, a vertex of a schematic object, an end of a schematic object, a nexus of a schematic object, or a handle of a schematic object; and
wherein the detected command is one of: a command to define a new item in the circuit;
a command to modify the position, size, shape, or another characteristic of an item; a command to stretch a dimension of a item; or a command to define a ruler or marker in the circuit.

24. The computer program product of claim 22, wherein presenting one or more of the targets to the user for selection comprises presenting one of the targets at a time to the user, and wherein the method further comprises receiving an input from the user to select the presented target and, in response thereto, moving the input cursor to a position of a portion of the presented target.

25. The computer program product of claim 22, wherein presenting the targets to the user comprises:

arranging the targets in an order;

presenting one of the targets to the user;

receiving an input from the user to present the next target in the order and, in response thereto, presenting the next target to the user.

26. The computer program product of claim 25, wherein presenting a target comprises altering the appearance of at least a portion of the target.

27. The computer program product of claim 25, wherein arranging the targets in an order comprises arranging the targets based upon one or more of:
   (i) distance to the input cursor,
   (ii) relevancy to the detected command,
   (iii) one or more characteristics of the targets,
   (iv) on at least one characteristic of a new item being created in the circuit and the relevancy of the characteristics of the targets to the at least one characteristic of the new item,
   (v) one or more customizable user setting for the detected command,
   (vi) one or more customizable global user setting applicable to a plurality of commands.

28. The computer program product of claim 22, wherein the method further comprises:
   receiving an input from the user to select a presented target and, in response thereto, selecting a point of the selected target as a first item usable by the detected command;
   defining for aperture around the input cursor, the other aperture being a second area of the layout space that encompasses the location of the input cursor in the layout space;
   collecting a second set of items, each item being at least partly located within said other aperture and associated with the circuit;
   selecting one or more items from the second set as one or more second targets suitable for the command to operate upon; and
   presenting one or more of the second targets to the user for selection.

29. The computer program product of claim 28, wherein presenting the second targets comprises:
   arranging the second targets in an order of presentation;
   presenting one of the second targets to the user; and
   receiving an input from the user to present the next second target in the order of presentation and presenting said next second target to the user.

30. The computer program product of claim 28, wherein presenting a second target comprises altering the appearance of at least a portion of the second target.

31. The computer program product of claim 28, wherein the method further comprises detecting a direction of cursor motion; and
   wherein arranging the second targets in an order of presentation comprises ordering each second target based on the orientation of a feature of the second target with respect to the detected direction of cursor motion.

32. The computer program product of claim 28, wherein the method further comprises receiving an input from the user to select a presented target and, in response thereto, selecting the target, the selected target being an object, an edge of an object, a stretch handle of an object, a nexus of an object, or a vertex of an object;
   wherein the detected command comprises a command to modify the position, size, shape, or other characteristic of an object related to the selected target by moving the selected target; and wherein the method further comprises determining a plurality of allowable locations that the selected target can be moved to without violating a set of design rules and restricting the motion of the input cursor to the plurality of allowable locations.

33. A circuit editing system that represents a circuit within a layout space, the circuit editing system comprising:
   a computer having at least one data processor, a display, one or more input devices to receive inputs, and a computer-readable memory; and
   a computer program product comprising a non-transitory computer-usable medium having a computer-readable program code embodied therein, the computer-readable program code to be executed to implement a method for circuit editing, the computer program product comprising:
   code that directs the computer to detect a command in a graphical circuit editor;
   code that directs the computer to define an aperture in the circuit for an input cursor displayed on the display, wherein the aperture is an area of the circuit layout space that encompasses one or more circuit objects and the location of the input cursor in the circuit layout space, wherein the input cursor and the aperture are moveable within the circuit layout space, and wherein the location of the aperture moves in relation to the movement of the input cursor;
   code that directs the computer to collect a set of items of the one or more circuit objects, each item being at least partly located within the aperture and associated with the circuit;
   code that directs the computer to select one or more items from the set as one or more targets suitable for the detected command to operate upon based upon one or more of: a relevancy to the detected command or one or more item types previously selected by the user or one or more customizable user settings for the detected command; and
   code that directs the computer to present one or more of the targets on the display.

34. The system of claim 33, wherein the code that directs the computer to present one or more of the targets on the display comprises:
   code that directs the computer to arrange the targets in an order based upon at least one of distance to the input cursor and relevancy to the detected command;
   code that directs the computer to present one of the targets one the display by altering the appearance of at least a portion of the target; and
   code that directs the computer to receive an input from the user to present the next target in the order and, in response thereto, presenting the next target on the display by altering the appearance of at least a portion of the target.

35. The system of claim 33, wherein the computer program product further comprises:
   code that directs the computer to receive an input from the one or more input devices to select a presented target and, in response thereto, to select a point of the selected target as a first item usable by the detected command;
   code that directs the computer to define another aperture for the input cursor, the other aperture being a second area of the layout space that encompasses the location of the input cursor in the layout space;
   code that directs the computer to collect a second set of items, each item being at least partly located within said other aperture and associated with the circuit;

code that directs the computer to select one or more items from the second set as one or more second targets suitable for the command to operate upon;

code that directs the computer to arrange the second targets in an order of presentation, the code including instructions that direct the computer to direct a direction of cursor motion and to order each second target based on the orientation of a feature of the second target with respect to the detected direction of cursor motion;

code that directs the computer to present one of the second targets on the display by altering its appearance; and code that directs the computer to receive an input from the one or more input devices to present the next second target in the order of presentation and to present said next second target on the display by altering its appearance.

36. The system of claim 33 wherein the computer program product further comprises:

code that directs the computer to receive an input from the one or more input devices to select a presented target and, in response thereto, to select the target, wherein the selected target is an object, an edge of an object, a stretch handle of an object, a nexus of an object, or a vertex of an object, and wherein the detected command comprises a command to modify the position, size, shape, or other characteristic of an object related to the selected target by moving the selected target; and code that directs the computer to determine a plurality of allowable locations that the selected target can be moved to without violating a set of design rules and restricting the motion of the input cursor to the plurality of allowable locations.

* * * * *